United States Patent [19]
Sakamoto et al.

[11] Patent Number: 5,535,873
[45] Date of Patent: Jul. 16, 1996

[54] ARTICLE DISPOSITION APPARATUS

[75] Inventors: Tetsuya Sakamoto, Kikuchi-gun; Sizuo Hagiwara, Amakusagun, both of Japan

[73] Assignee: Mitsubishi Denki Kabushiki Kaisha, Tokyo, Japan

[21] Appl. No.: 306,479

[22] Filed: Sep. 15, 1994

[30] Foreign Application Priority Data

Sep. 17, 1993 [JP] Japan ..................................... 5-231668

[51] Int. Cl.⁶ ................................................... B65G 47/26
[52] U.S. Cl. ........................................... 198/434; 198/431
[58] Field of Search .................................. 198/431, 434, 198/456, 460.1, 460.3, 464.3, 502.3, 345.1; 414/416, 433

[56] References Cited

U.S. PATENT DOCUMENTS

| | | | |
|---|---|---|---|
| 2,793,771 | 5/1957 | Ochs | 198/431 |
| 2,986,262 | 5/1961 | Powers | 198/456 |
| 3,102,627 | 9/1963 | Acton et al. | 198/345.1 |
| 4,120,393 | 10/1978 | Motooka et al. | 198/460.1 |
| 4,765,452 | 8/1988 | Johansson | 198/431 |
| 4,982,553 | 1/1991 | Itoh | 198/433 |

FOREIGN PATENT DOCUMENTS

64-67934  3/1989  Japan .

*Primary Examiner*—Joseph E. Valenza
*Attorney, Agent, or Firm*—Leydig, Voit & Mayer

[57] ABSTRACT

An article disposition apparatus capable of disposing articles such as ICs at any arbitrary disposition pitch by a simple arrangement in a time efficient manner. The article disposition apparatus according to the present invention comprises a stainless steel belt for transferring articles, a sensor for sensing the passing of the articles transferred by the stainless steel belt, a plurality of adsorption devices disposed each other at a predetermined pitch in the direction of transfer carried out by the stainless steel belt for holding the articles transferred by the stainless steel belt, respectively, and a control circuit for controlling a plurality of the adsorption devices so that the articles being transferred are held by a plurality of the adsorption devices in response to the passing of the articles sensed by the sensor.

14 Claims, 11 Drawing Sheets

DETECTOR FOR A SECURITY THREAD HAVING AT LEAST TWO SECURITY DETECTION FEATURES

BACKGROUND OF THE INVENTION

This invention relates to apparatus for verifying the authenticity of documents, and more particularly to such verification apparatus for detecting a metallized security thread embedded in currency or banknote paper and for determining its authenticity by detecting the currency paper's denomination indicated by coded metallic patterns disposed on a surface of the security thread.

It is known in the art of currency and banknote papers to incorporate or embed a security thread partially or fully within the paper. The use of such security threads has increased due to the increasing prevalence of high-resolution scanners and true-color photocopying machines and printers—the tools of modern counterfeiters. If modern currency or banknote papers do not have an embedded security thread, the currency can be more easily duplicated with a color photocopier. However, if the security thread is embedded within the paper, the characteristics of the thread are harder to illicitly reproduce.

It is known in the art that the thread may comprise a plastic film or substrate having selected aluminum characters formed on one or both surfaces of the substrate. The thread is typically embedded entirely within the currency paper and is not present on either surface of the paper. Such security threads for use in U.S. currency are described in greater detail in U.S. Pat. Nos. 4,652,015 and 4,761,205. The security thread has printed characters of extreme fine-line clarity and high opacity such that human-readability of the printing is possible by means of transmitted light. Yet, the printing remains completely indiscernible to the human eye under reflected light. Further, the highly reflective metallic coating causes the thread to virtually disappear under the reflected light used by modern photocopier equipment. If the printing were legible under reflected light, the public could rely upon the presence of the printed matter solely by visual inspection. The printing would then be easily replicated by counterfeit means.

The aforementioned patents ensure that the public does not come to rely on such an easily simulated security thread characteristic. This is accomplished by a method of manufacturing currency and banknote papers containing a security thread that is virtually invisible under reflected light with no manifestation on the surface of the currency or banknote paper that such a security thread is present within the note. Thus, authentication of such a security thread is carried out in a two-fold test; namely, wherein the thread is legible under transmitted light and invisible under reflected light.

An easy way of checking the authenticity of such a security thread is to place the currency under an intense light source to observe the thread characters by the human eye. Although visual inspection can generally detect the counterfeit notes (given the proper lighting conditions), visual inspection is slow, time consuming and expensive. Further, in commercial situations where such an intense light source is unavailable (thus making a human check for thread presence and authenticity virtually impossible), it is desirable to provide means for automatically determining the thread's presence and authenticity. Various means for verifying the presence and authenticity of the aforementioned security thread are exemplified in U.S. Pat. Nos. 4,980,569 and 5,151,607.

The '569 patent discloses a verification device comprising two optical light source/detector pairs disposed on opposite sides of a currency paper. The source and detector pairs are arranged for transmission and reception of optical energy through the currency if the thread is not present. Also, the source and detector pairs can determine the presence of a counterfeit thread on the currency surface by checking for light reflected off of the currency surface. Thus, the '569 patent provides a two-fold test wherein the thread, to be genuine, must be detected under transmitted light, and not be detected under reflected light. However, the device in the '569 patent may give a false indication of the authenticity of a counterfeit currency when a pencil line is drawn on the currency surface at the normal thread location.

In an attempt to overcome the shortcomings of the '569 patent, the '607 patent discloses a verification device comprising the optical means of the '569 patent in combination with a magnetic detector. The magnetic detector determines the presence of the security thread, while the optical means determines whether the thread is properly within the currency or improperly disposed on either surface.

In light of the shortcomings of optical methods of verifying the presence of the security thread within the currency paper, other verification means have been developed, such as capacitive devices. These devices operate on the principle of detecting a change in capacitance of a sensor, such change being due to the dielectric properties of the metallized security thread. The metallized thread has dielectric properties that are vastly different from those of the paper. The security thread operates as one plate of a capacitor, and draws charge off of a second plate of the capacitor, the second plate typically being a sensing part of the verification device. In contrast, the paper itself has little or no effect on the amount of charge on the sensing plate. Thus, the security thread effectively increases a capacitance value that is sensed by the verification device, a detectable feature.

However, capacitance verification devices have shortcomings in that they can also be fooled by conductive marks, such as pencil lines, placed on the surface of the currency. This can be especially problematic for currency verification devices used for unattended transactions; for example, in vending machines that incorporate currency acceptors. Automatic vending machines, such as those that dispense soft drinks and cigarettes, are gradually accepting higher denomination currency bills in unattended transactions as payment. This is due, in part, to the inflationary prices of goods. Also, unattended bill acceptors are expanding into areas such as gaming and other entertainment vending areas, and gas stations. The addition of bill acceptors and/or changers in these vending machines has resulted in a large increase in sales for unattended transactions. For these types of machines, it is imperative that the bill acceptor/changer have some means for reliably discriminating between genuine and counterfeit bills. Examples of security thread verification devices that provide for machine readability of a metallized security thread using a capacitance bridge technique are disclosed in U.S. Pat. Nos. 5,308,992 and 5,394,969.

The aforementioned security thread may have its printed characters formed on the plastic substrate either in the form of positive image metal characters or partially demetallized threads that display negative image or clear characters. In other words, the positive image thread has metal characters formed on the plastic substrate. The metal only occupies the areas on the thread defined by the characters. Such positive image threads are used in United States currency paper. On the other hand, the negative image thread has its characters formed by the removal of metal at the desired character locations. The non-character portion of the thread surface is coated with metal. Therefore, the non-metal or "clear text" characters are defined by metal boundaries. Such negative image security threads are used in currencies such as the German Deutsche Mark.

In contrast to the two types of security threads described hereinabove having selected metallized characters formed thereon, it is known in the art to use a "solid" security thread. Such a thread comprises a plastic substrate having metal (e.g., aluminum) deposited entirely on one or both surfaces of the plastic substrate. Such "solid" or "continuously metallized" threads sometimes have indicia printed thereon indicative of, e.g., currency denomination. However, normally the printing cannot be seen even under an intense light source; therefore, such printing is oftentimes eliminated. It is known to use such "solid" security threads within the currency of, e.g., Saudi Arabia.

The aforementioned three types of security threads may all be visually detected by the human eye by first holding the currency paper up to relatively strong transmitted light and then verifying the presence of the thread within the paper. Also, these threads may also be automatically or machine detected by various means, including the aforementioned capacitive detection schemes. However, all such schemes merely determine only the presence or absence of the three types of thread within the paper. The authenticity of the paper then depends only upon the presence or absence of the thread within the paper. With such threads, there typically is no known method of determining a distinguishing feature of the paper, such as its denomination, using capacitive techniques. This is due primarily to the small size of the characters formed on the thread. Instead, optical character recognition or other imaging-based schemes would have to be employed to ascertain such relatively detailed information, such as denomination, as indicated by the printed text used by the aforementioned security threads.

In the alternative, the aforementioned threads or other types of threads may be coated with a layer of magnetic material, and also with either a luminescent, an x-ray absorbent, or a non-magnetic metal material. The magnetic material may be applied in a coding pattern (e.g., magnetic coating applied discontinuously onto a thread with the discontinuities detected with a field-detecting device, or two different magnetic materials provided in alternating bands along the thread), as described in U.S. Pat. No. 4,183,989. However, such feature, although machine readable, does not offer a public security feature, such as printed text, that is visual under transmitted light. Moreover, relying upon the field produced by a certain magnitude or configuration of magnetic materials is problematic in that such coded variations are subject to obliteration by intentional or accidental demagnetization subsequent to the original magnetization.

In addition, although magnetic metal, such as iron oxide coatings, can be applied discontinuously onto a thread in a bar code-like sequence or in varying depths of coating, to accomplish a machine-readable feature, such application processes require specialty screen printing equipment to apply the iron oxide slurry in defined bars. Moreover, magnetic field array detectors are required to resolve the coded sequence. These array detectors are expensive to manufacture and are particularly problematic for reading threads when banknotes or other documents are processed narrow-edge versus wide-edge, where the number of sites on the array that are processed for the wide-edge feed condition are reduced.

Therefore, in response to the difficulty of obtaining a relatively simplified method of providing a security thread having easily-implementable features indicative of denomination, a security thread may be provided comprising a plastic substrate having a sequence of coded metallic patterns deposited on one or both substrate surfaces in a repeating pattern. Such repeating pattern provides a first type of security detection feature. A second type of security detection feature is provided by metallic indicia, either in the form of positive- or negative-image characters formed at various locations within the repeating metallic patterns. This second security feature allows for manual visual verification by the human eye of both the thread and its denomination under relatively strong transmitted light.

Accordingly, it is a primary object of the present invention to provide a device that verifies both the authenticity and denomination of a currency paper.

It is a general object of the present invention to provide a device that verifies both the authenticity and denomination of a currency paper by detecting a security thread embedded within the paper.

It is a further object of the present invention to provide a device that verifies both the authenticity and denomination of a currency paper having a rectangular-shaped security thread embedded therein, wherein the security thread is normally embedded in the paper in a direction parallel to the narrow edge of the paper, the device being able to detect the thread as the device is passed over the thread either parallel to the long dimension of the thread (i.e., in the wide-edge direction), or perpendicular to the long dimension of the thread (i.e., in the narrow-edge direction).

It is still another object of the present invention to provide a device that rapidly senses and counts the number of electrically-conductive patterns on a security thread embedded within currency paper or the like in order to both authenticate the currency paper and determine its denomination.

It is yet another object of the present invention to provide for high-speed, automated document verification.

It is still another object of the present invention to provide for cost-effective counterfeit deterrence in security documents such as currency paper.

It is another object of the present invention to provide for a currency paper authentication and denomination determining device that can be easily and cost effectively incorporated into known or future automated processing equipment, such as high-speed central bank sorting machines, low-cost table-top currency counters found in local bank branches or businesses, and bill acceptors and/or changers embodied in vending machines.

It is yet still another object of the present invention to provide for accurate low-cost, high-speed commercial sorting of currency paper.

The above and other objects and advantages of this invention will become more readily apparent when the following description is read in conjunction with the accompanying drawings.

SUMMARY OF THE INVENTION

To overcome the deficiencies of the prior art and to achieve the objects listed above, the Applicant has invented a device for both authenticating currency paper and determining its denomination.

The device performs the above functions by detecting the presence of a metallized security thread embedded within the document and "reading" the denomination therefrom.

to the center in the width direction of the stainless steel belt 25. Whether the IC 21 arrives at the center of the correction unit 28 or not can be determined by, for example, counting the pulses generated from the encoder 27 connected to the motor 26 or confirming the elapse of a preset time.

When the IC 21 whose position is corrected as described above is sensed by the second sensor 30, the control circuit 34 starts to count the pulses generated from the encoder 27. When the counted pulses reach a value corresponding to an amount of movement Sa of the stainless steel belt 25, the control circuit 34 determines that the IC 21 has been transferred just below the first adsorption device 31a of the adsorption unit 32 and causes the air source 33 to suck the air in the adsorption device 31a. With this operation, the IC 21 which is about to pass just below the first adsorption device 31a is adsorbed to and held by the adsorption device 31a. At this time, the held IC 21 is located upwardly of the surface of the stainless steel belt 25 by a predetermined distance so that the next IC 21 can pass below the IC 21.

The ICs 21 successively transferred on the stainless steel belt 25 are centered by the correction unit 28 in the same way, then sensed by the second sensor 30 and the control circuit 34 starts to count the pulses from the encoder 27 again. When the counted pulses have a value corresponding to an amount of movement Sb of the stainless steel belt 25, the control circuit 34 causes the air source 33 to suck the air in the second adsorption device 31b of the adsorption unit 32. With this operation, the IC 21 which is about to pass just below the second adsorption device 31b is adsorbed to and held by the adsorption device 31b.

In the same manner, a plurality of the ICs 21 placed on the stainless steel belt 25 by the first adsorption unit 24 are successively centered by the correction unit 28 and sensed by the second sensor 30, then adsorbed to and held by the corresponding adsorption devices of the second adsorption unit 32 at the positions where they have been transferred by the number of corresponding pulses, respectively. Note, the disposition pitch of the adsorption devices 31a, 31b, 31c . . . of the second adsorption unit 32 is preset to the same value as that of the disposition pitch of the sockets 18 of a board 17 in which the ICs 21 having been disposed are to be accommodated.

Figure 1:
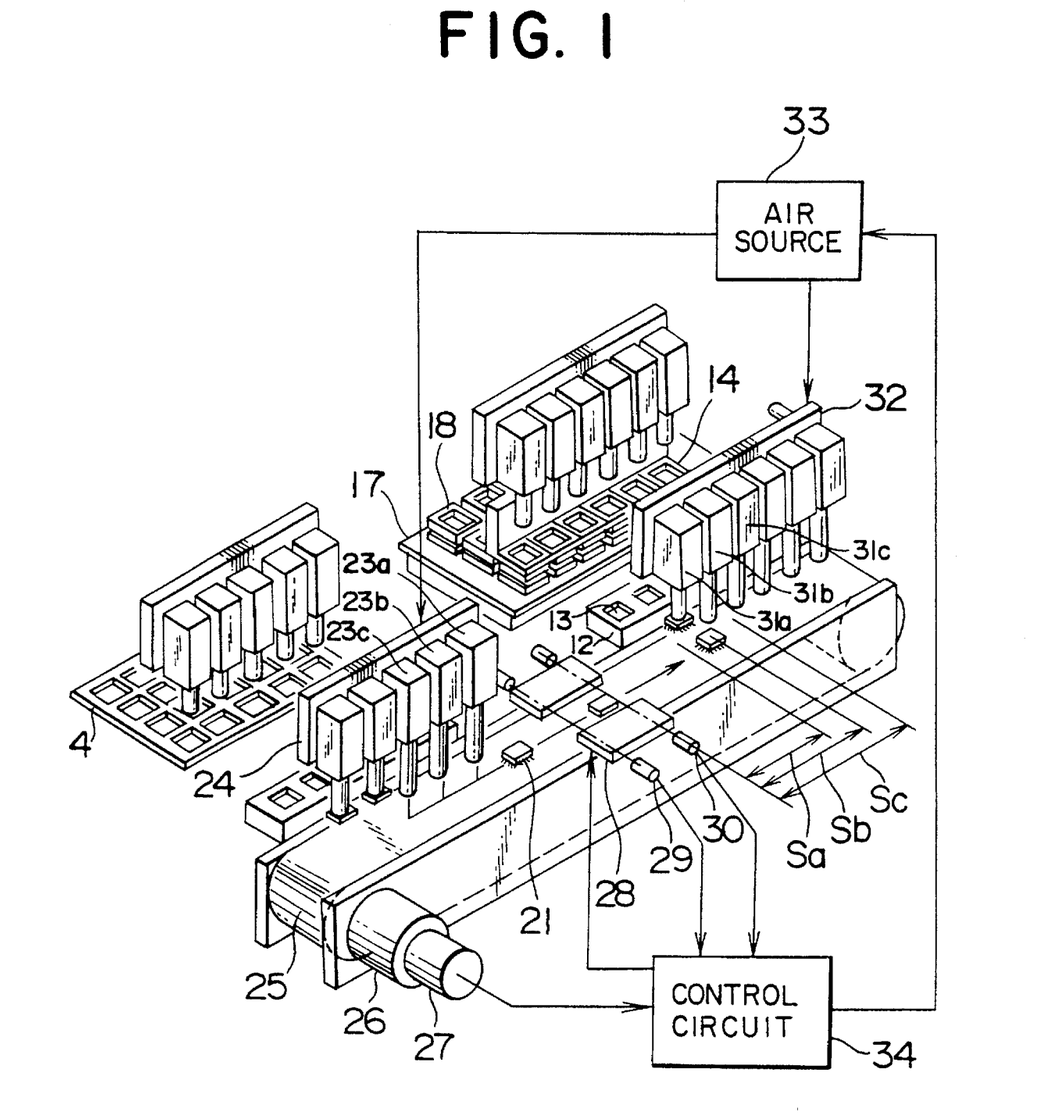

Thereafter, the second adsorption unit 32 is moved by the not shown moving unit and the suction of the air in the respective adsorption devices of the adsorption unit 32 is stopped by the air source 33 so that a plurality of the ICs 21 held by the adsorption unit 32 are simultaneously fallen into the corresponding positioning grooves 13 of a positioning block 12, respectively. A plurality of the ICs 21 positioned as described above are adsorbed to and held again by the respective adsorption devices of the adsorption unit 32 and simultaneously accommodated in the corresponding IC sockets 18 on the board 17 placed beside the positioning block 12. In FIG. 1, numeral 14 denotes a lid opening/closing jig for opening and closing the lids of the sockets 18 on the board 17.

Figure 2:
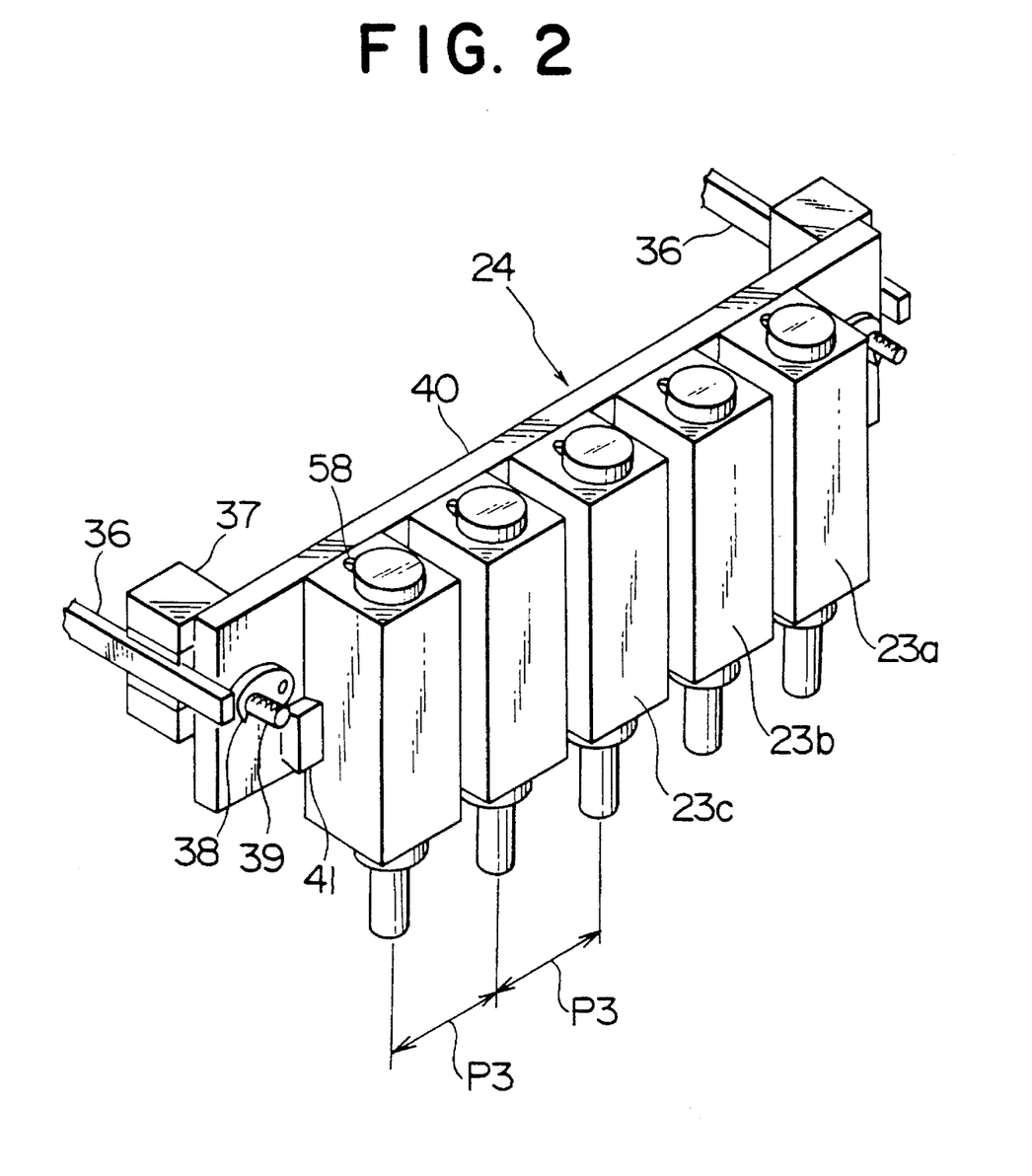

FIG. 2 shows the first adsorption unit 24. The adsorption unit 24 has a mounting plate 40 provided with a rail 41 formed on the surface thereof and a plurality of the adsorption devices 23a, 23b, 23c are fixed to the rail 41 by use of set screws 58, respectively. The respective adsorption devices can be moved along the rail 41 by loosening the set screws 58, whereby a pith P3 between the adjacent adsorption devices can be set to an arbitrary value.

Figure 3:
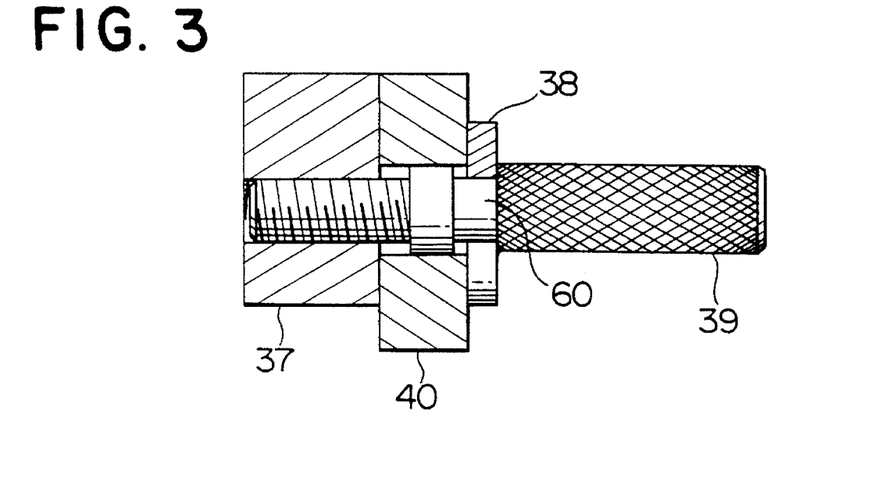

The mounting plate 40 is detachably fixed to blocks 37 provided with LM (linear motion) guides 36 by hooks 38 and mount pins 39. FIG. 3 shows a portion mounted to the block 37 in detail. The mount pin 39 is threaded with the block 37 and the hook 38 is located in the groove 60 defined to the mount pin 39 so that the mounting plate 40 is fixed to the block 37 together with the hook 38 by the mount pin 39.

Figure 4:
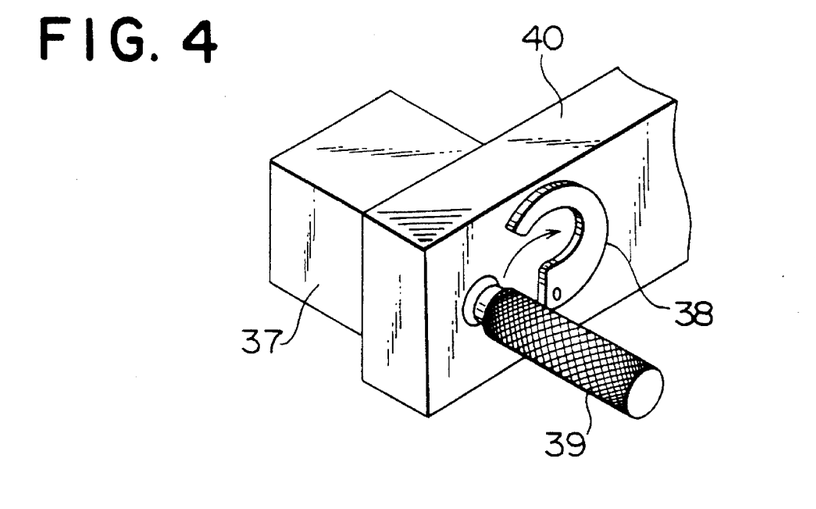
Figure 5:
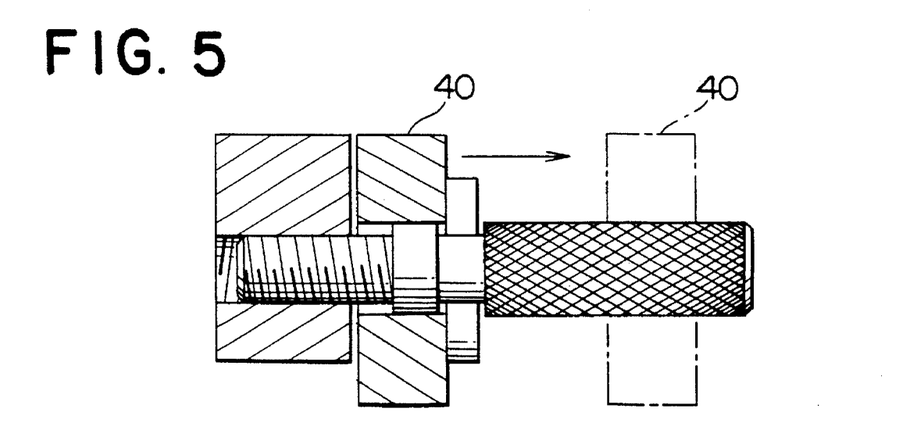

When the mount pin 39 shown in FIG. 4 is loosened and can be removed from the groove 60 of the mount pin 39. As shown in FIG. 5, when the mounting plate 40 is pulled in parallel with the mount pin 39 in this state, the adsorption unit 24 can be removed from the block 37. On the other hand, when the adsorption unit 24 is to be mounted on the block 37, the mounting plate 40 is pressed against the block 37 using the mount pin 39 as a guide and the hook 38 is rotated and inserted into the groove 60 of the mount pin 39. Further, when the mount pin 39 is tightened, the mounting plate 40 is fixed to the block 37 together with the hook 38.

The second adsorption unit 32 also has the same structure as that of the aforesaid first adsorption unit 24.

Figure 6:
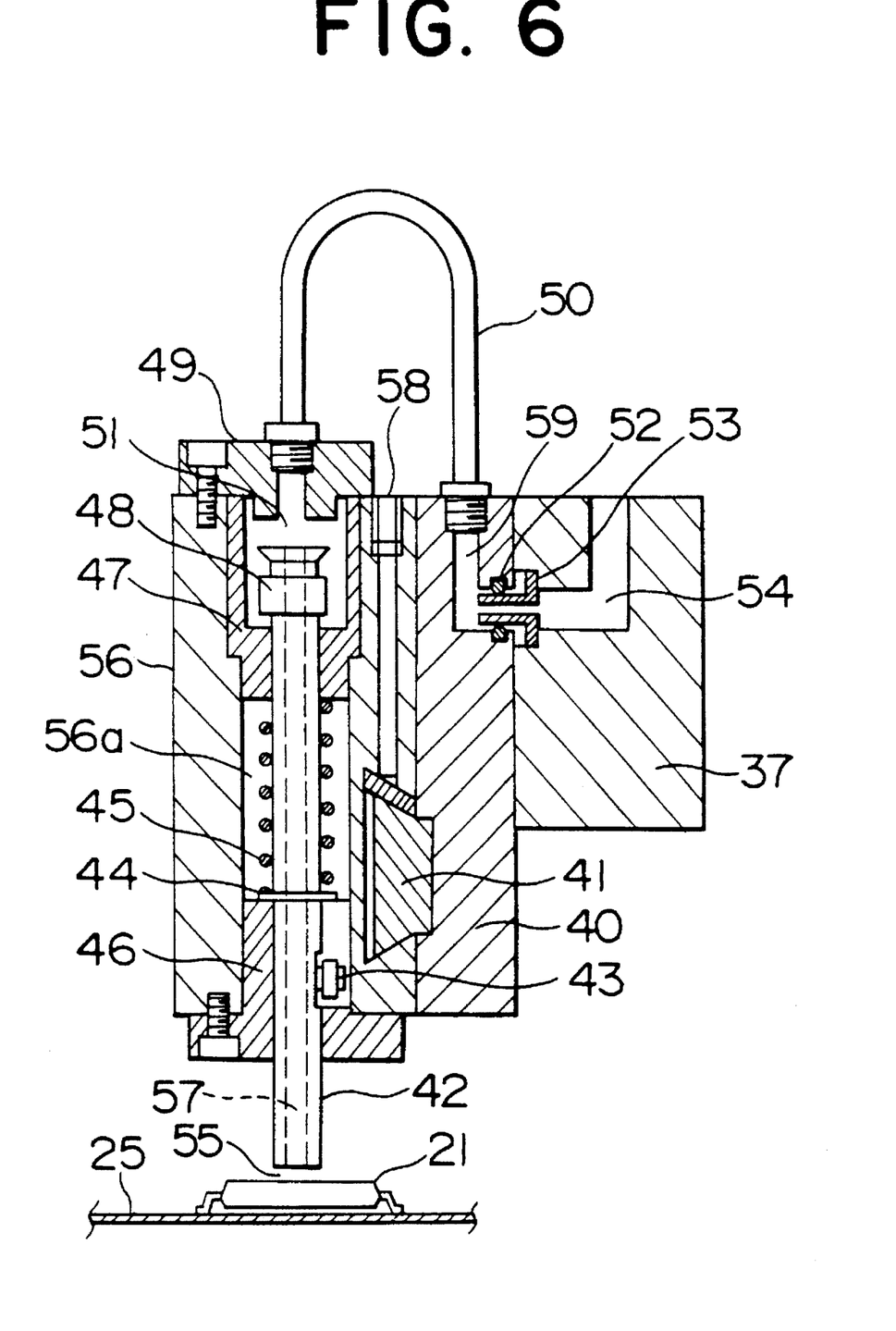

Next, FIG. 6 shows the respective adsorption devices mounted on the first and second units 24 and 32 in detail. Guides 46, 47 are fixed to the upper portion and the lower portion of the passing-through hole defined to a housing 56, respectively and a hollow portion 56a is formed between the guides 47 and 46. An adsorption tube 42 is slidably disposed by passing through the guides 47 and 46, respectively. In FIG. 6, numeral 43 denotes a bearing to ease the sliding of the adsorption tube 42. A locking ring 44 is attached to the outer periphery of adsorption tube 42 located in the hollow portion 56a and a spring 45 surrounding the adsorption tube 42 is disposed between the locking ring 44 and the lower surface of the upper guide 47. The locking ring 44 is pressed against the upper surface of the lower guide 46 by the spring 45. A rubber pad 48 is attached to the outer periphery of the upper portion of the adsorption tube 42 passing through the upper guide 47. An air hose fixture 49 is fixed to the upper portion of the upper guide 47 so that an air reservoir 51 is formed between the upper guide 47 and the fixture 49. The uppermost portion of the adsorption tube 42 and the rubber pad 48 are located in the air reservoir 51.

The housing 56 is fixed to the rail 41 of the mounting plate 40 by use of the set screw 58. An air port 59 is defined to the mounting plate 40 to connect the upper surface thereof to the back surface thereof in contact with the block 37 and an air hose 50 is disposed between the upper surface of the mounting plate 40 and the air hose fixture 49, whereby the air reservoir 51 is connected to the air port 51. An O ring 52 is disposed to the outer periphery of the air port 59 opened to the back surface of the mounting plate 40. On the other hand, an air port 54 is also defined to the block 37 to which the mounting plate 40 is fixed and a nozzle 53 is attached to an end of the air port 54. When the mounting plate 40 is abutted against the block 37, the nozzle 53 is inserted into the O ring 52 so that the air port 54 can be easily connected to the air port 59. The air source 33 shown in FIG. 1 is connected to the other end of the air port 54 of the block 37.

Figure 7:
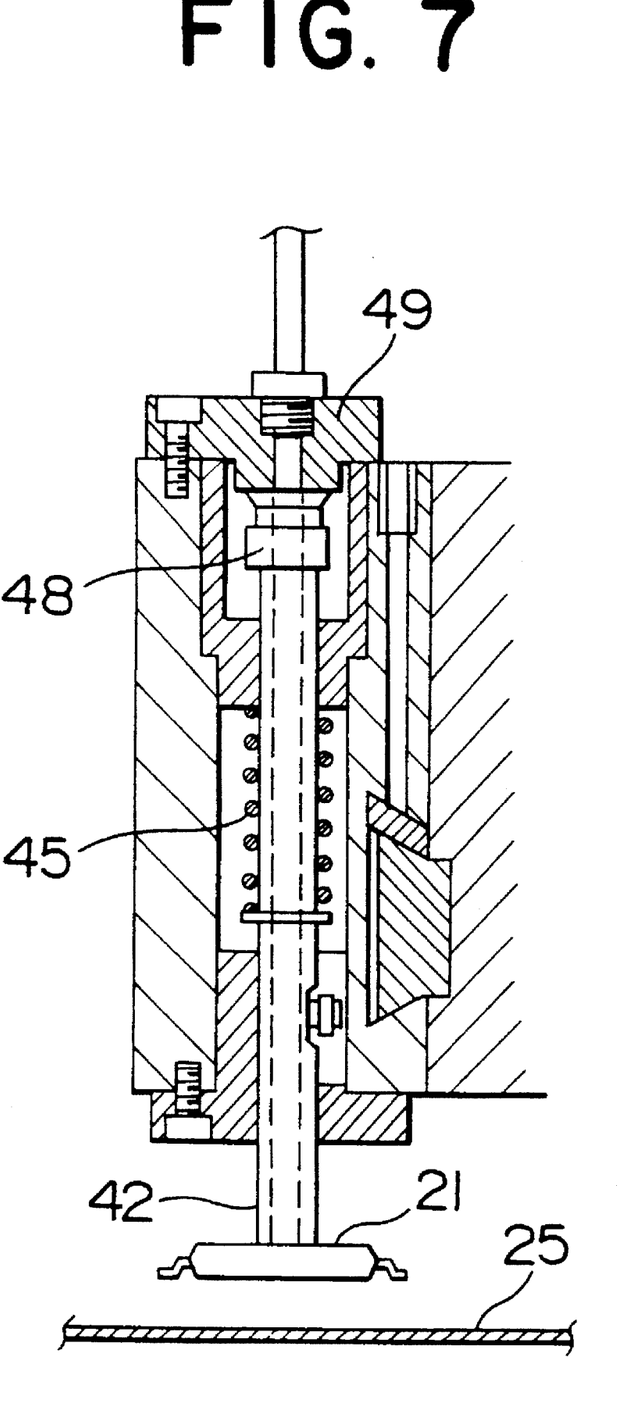

Next, operation of the adsorption device will be described. When the IC 21 transferred on the stainless steel belt 25 reaches just below the adsorption tube 42, air is sucked from the air port 54 by the air source 33 so that the air reservoir 51 and the interior of the adsorption tube 42 are evacuated through the air port 59 and the air hose 50. Consequently, the IC 21 is sucked toward the adsorption tube 42 and adsorbed to and held by the lower end of the adsorption tube 42. At this time, since a gap 55 formed between the adsorption tube 42 and the IC 21 is shut off, a degree of vacuum in the interior of the adsorption tube 42 and in the air reservoir 51 increases. Thus, the adsorption tube 42 is sucked upward at the time when a force caused by vacuum is made greater than the pressure of the spring 45 and the adsorption tube 42 is moved upward while adsorbing and holding the IC 21 until the rubber pad 48 comes into contact with the air hose fixture 49 as shown in FIG. 7. Therefore, the next IC 21 transferred on the stainless steel belt 25 passes just below the IC 21 adsorbed to and held by the adsorption tube 42 and can reach the position of another adsorption device.

As described above, the adsorption units 24 and 32 used in the embodiment t can be easily mounted on and dismounted from the block 37 of the adsorption unit as well as can be simply connected to the air source 33 by the O ring 52 and the nozzle 53. Further, a pitch between the heads of a plurality of the adsorption devices in the adsorption units can be easily changed.

Figure 8:
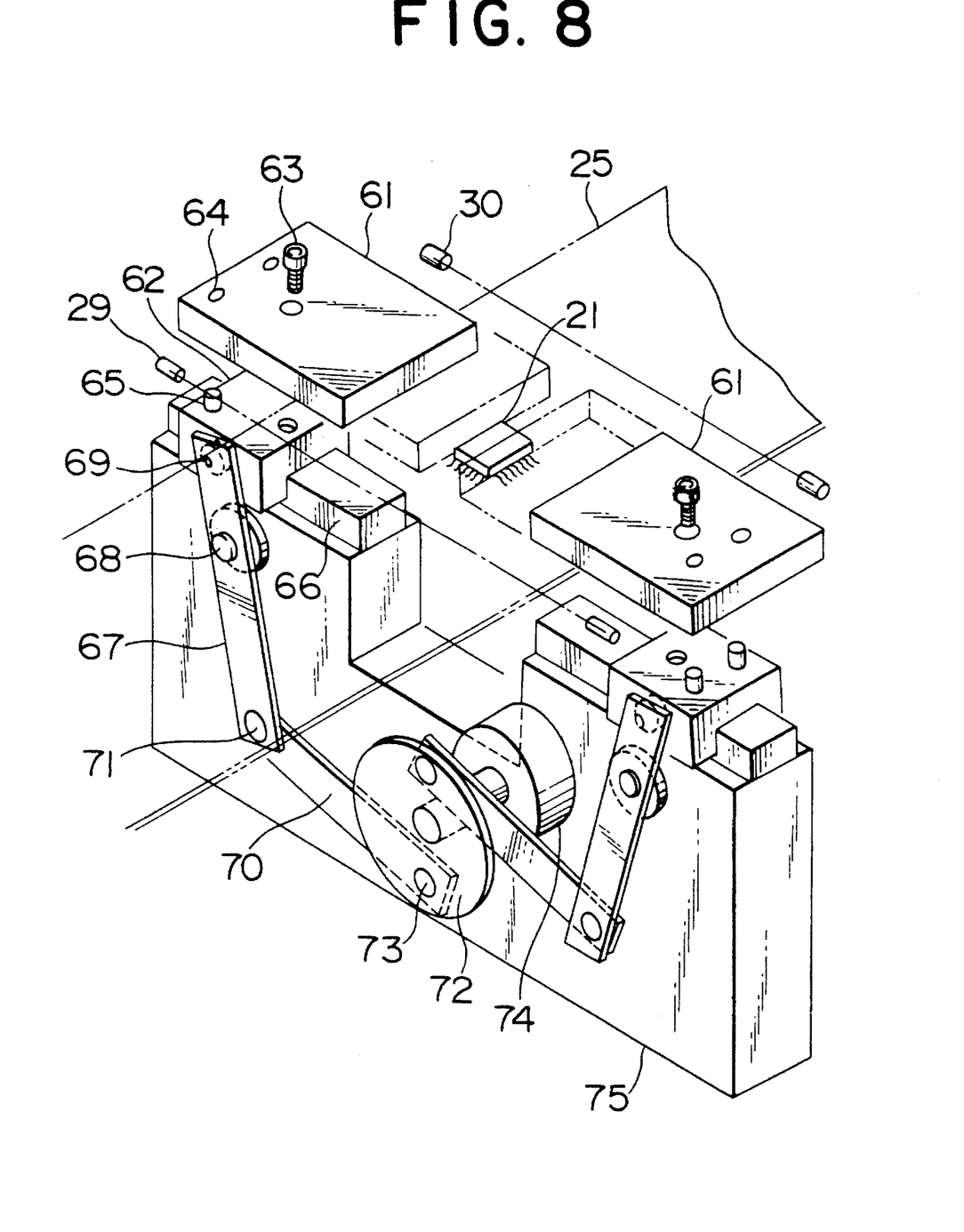

Next, FIG. 8 shows the correction unit 28 in detail. A mounting base 75 is disposed below the stainless steel belt 25 and an LM (linear motion) guide 66 is formed on the mounting base 75 in the direction perpendicular to the direction in which the stainless steel belt 25 moves. A pair of blocks 62 are slidably disposed to the LM guide 66 and a guide plate 61 is fixed onto each of the blocks 62 by a bolt 63. The block 62 can be aligned with the guide plate 61 by inserting a guide pin 65 provided with the block 62 into the guide hole 64 defined to the guide plate 61.

Figure 9:
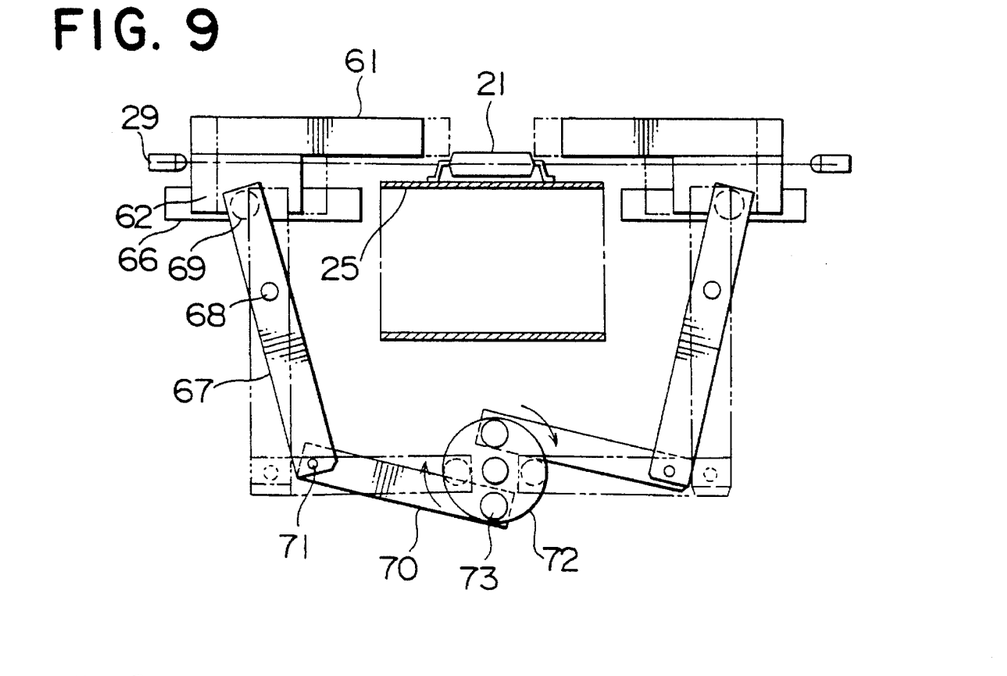

Each of the blocks 62 is connected to a disk plate 72 through a first arm 67 and a second arm 70 and an actuator 74 is connected to the disk plate 72. An end of the first arm 67 is connected to a roller 69 provided with the block 62, the intermediate portion thereof is rotatably supported by a fulcrum 68, and the other end thereof is rotatably connected to an end of the second arm 70 through a fulcrum 71. The other end of the second arm 70 is rotatably connected to the disk plate 72 through a fulcrum 73. A pair of the guide plates 61 are moved above the stainless steel belt 25 in the direction perpendicular to the direction in which the stainless steel belt 25 moves by driving the actuator 74 as shown in FIG. 9.

Operation of the correction unit 28 will be described. When the IC 21 transferred on the stainless steel belt 25 is sensed by the first sensor 29, the control circuit 34 drives the actuator 74 at the time when the IC 21 is supposed to reach between a pair of the guide plates 61. With this operation, the disk plate 72 rotates 180° in the direction shown by an arrow as shown in FIG. 9. First, the second arm 70 is pushed by the distance corresponding to the rotational radius of the fulcrum 73 provided with the disk plate 72 by the initial rotation of 90° so that the first arm 67 rotates about the fulcrum 68 and the roller 69 swings. More specifically, a pair of the guide platels 61 approach to each other together with the blocks 62 so that the IC 21 placed on the stainless steel belt 25 is centered to the center in the width direction of the stainless steel belt 25 by being pushed by the guide plates 61. When the disk plate 72 further rotates 90°, the first arm 67 and the roller 69 returns to the original positions thereof and a pair of the guide plates 61 go away from each other.

Since the disk plate 72 makes a rotational motion, the guide plates 61 moves along a sine wave. Consequently, only a small impact is applied from the guide plates 61 to the IC 21 in correction, thus the IC 21 can be centered without being scratched.

The ICs 21 can be also securely adsorbed and held in such a manner that the position of each IC 21, which has been placed by the first adsorption unit 24, in the width direction of the stainless steel belt 25 is sensed and the second adsorption unit 32 is moved in the width direction of the stainless steel belt 25 according to the position of the each sensed IC 21, in place of centering the IC 21 by the correction unit 28.

In the embodiment 1, although a plurality of the ICs 21 are simultaneously held by means of the first adsorption unit 24 and successively-supplied onto the stainless steel belt 25, the present invention is not limited to this arrangement. The ICs 21 are centered by the correction unit 28 and then adsorbed and held after having been sensed by the second sensor 30 and transferred by the predetermined amounts of movement of Sa, Sb, Sc . . . Consequently, even if the ICs 21 are placed on the upstream side of the stainless steel belt 25 one by one or even if a plurality of the ICs 21 are placed thereon at random, they are securely adsorbed to and held by the second adsorption unit 32.

Further, although the ICs 21 are successively adsorbed to and held by a plurality of the adsorption devices 31*a*, 31*b*, 31*c* . . . of the second adsorption unit 32 in the order of them located nearer to the upstream side of the direction in which the ICs 21 are transferred by the stainless steel belt 25, the present invention is not limited to this disposition, and for example, the ICs 21 may be successively held by the adsorption devices in the order of them located nearer to the downstream side of the direction in which the ICs 21 are transferred.

Embodiment 2

Figure 10:
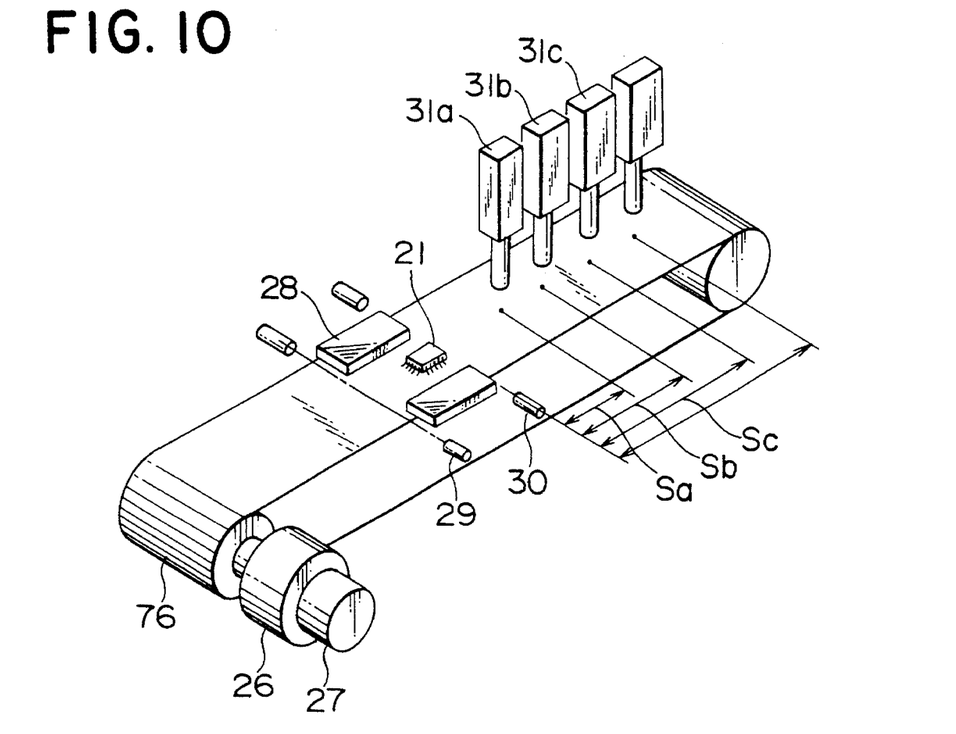

Although the embodiment 1 uses the stainless steel belt 25 driven by the motor 26 as the transfer means, a belt 76 composed of a dielectric material such as a metal, resin or the like other than the stainless steel belt may be driven as shown in FIG. 10. Any material may be used as a material of the belt 76 unless it does not scratch the leads of the IC 21 to be transferred.

Embodiment 3

Figure 11:
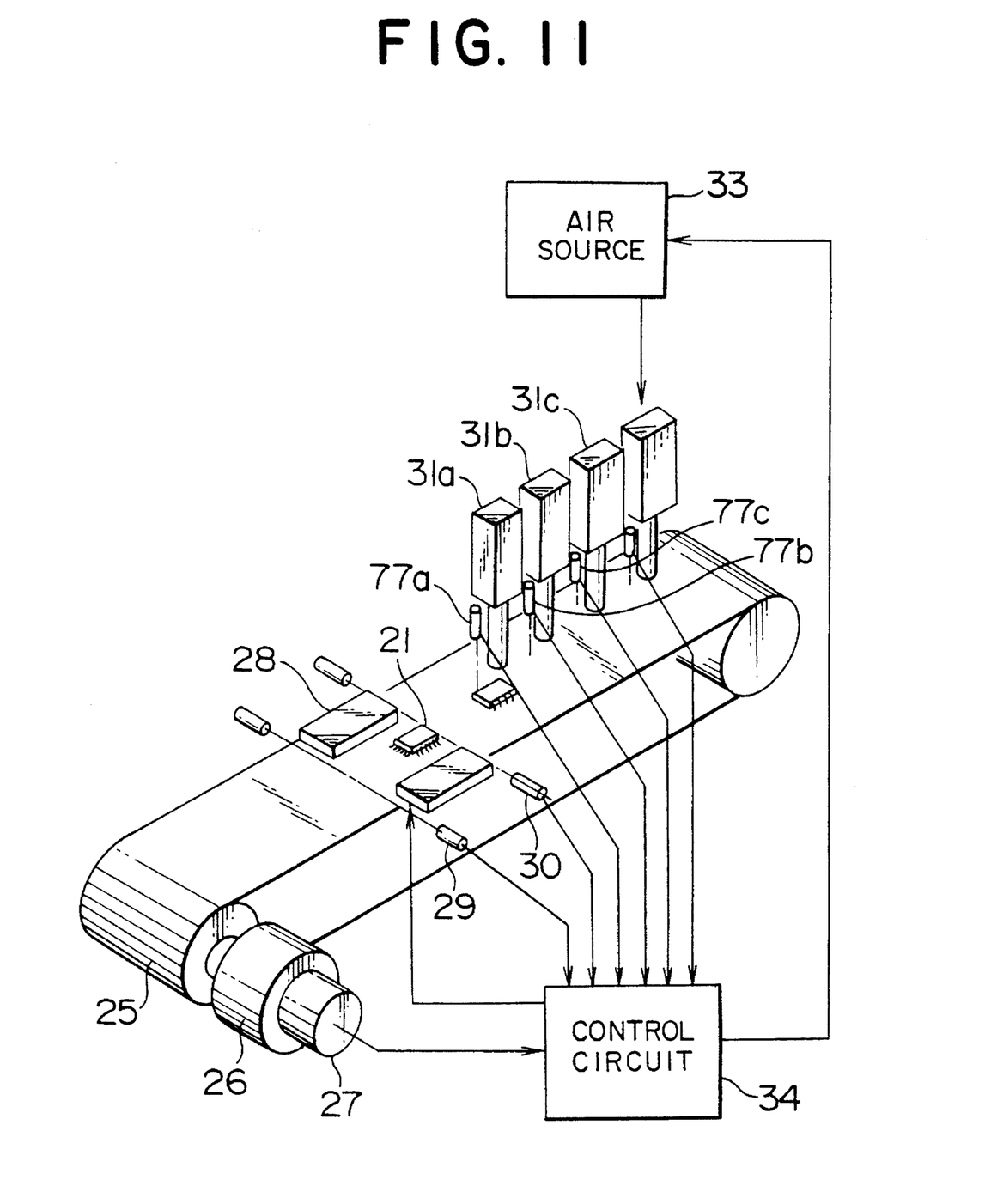

As shown in FIG. 11, sensors 77*a*, 77*b*, 77*c* . . . for sensing the arrival of the ICs 21 are disposed in the vicinity of the adsorption devices 31*a*, 31*b*, 31*c* . . . of the second adsorption unit 32, respectively and these sensors 77*a*, 77*b*, 77*c* . . . may be used as sensing means of the present invention. More specifically, when the respective sensors 77*a*, 77*b*, 77*c* . . . sense the ICs 21 transferred on the stainless steel belt 25, the sensors output sensing signals to the control circuit 34 to cause the respective corresponding adsorption devices 31*a*, 31*b*, 31*c* . . . to absorb the sensed ICs 21 through the air source 33. With this disposition, the pulses from the encoder 27 need not be read.

When, however, the ICs 21 are sensed by the sensors 77*a*, 77*b*, 77*c* . . . in the vicinity of the respective adsorption devices 31*a*, 31*b*, 31*c* . . . as well as the ICs 21 are sensed by the second sensor 30 and the pulses from the encoder 27 are counted as described in the embodiment 1 and a result of detection by the sensors 77*a*, 77*b*, 77*c* . . . is verified by the count of the pulses, the ICs 21 can be more securely adsorbed and held.

Embodiment 4

Figure 12:
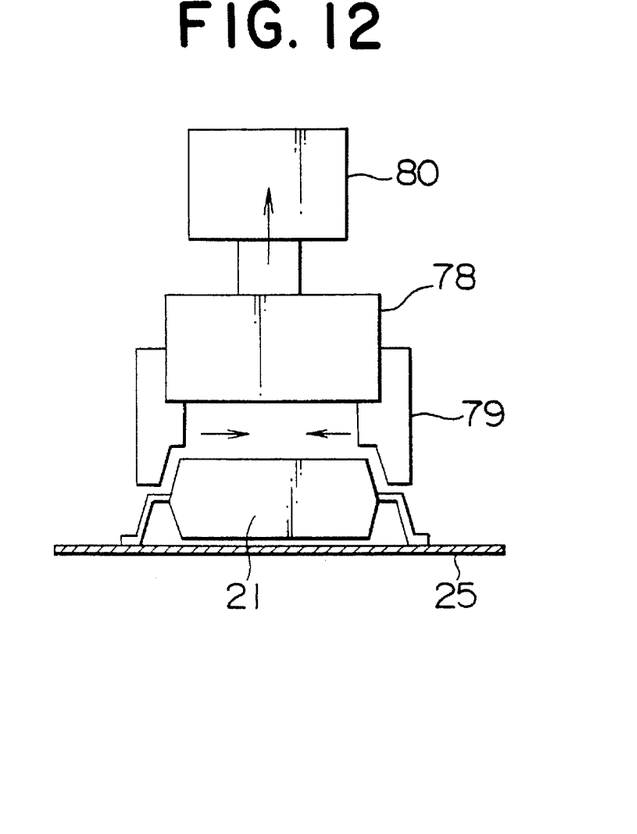

Although the embodiment 1 adsorbs and holds the ICs 21 by vacuum by using he adsorption devices as the holding means, the present invention is not limited thereto. For example, as shown in FIG. 12, the IC 21 may be mechanically held by the claws 79 of a mechanical chuck 78. When the IC 21 is held by the claws 79 and then the mechanical chuck 78 is lifted up by a cylinder 80 together with the IC 21, the next IC 21 transferred on the stainless steel belt 25 can pass below the lifted IC 21.

Embodiment 5

Figure 13:
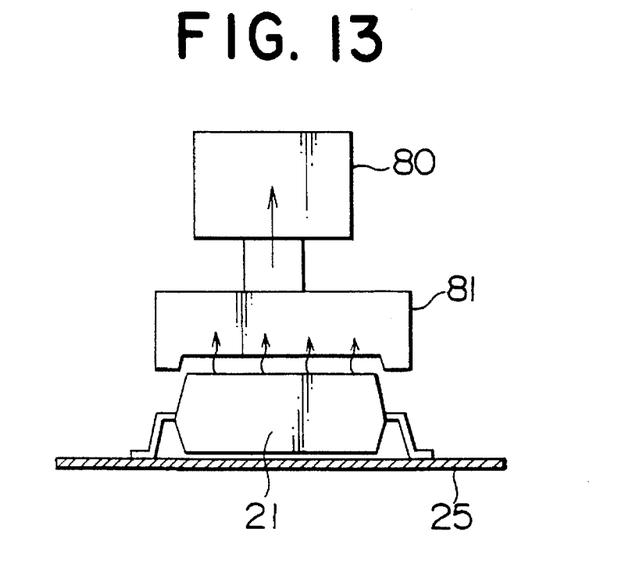

When an article such as the IC 21 and the like can be held by magnetic force, an electromagnet 81 may be used as the holding means as shown in FIG. 13. When the article is held by the electromagnet 81 and then the electromagnet 81 is lifted up by the cylinder 80, the next article transferred on the stainless steel belt 25 can pass below the lifted article also in this case.

Embodiment 6

Figure 14:
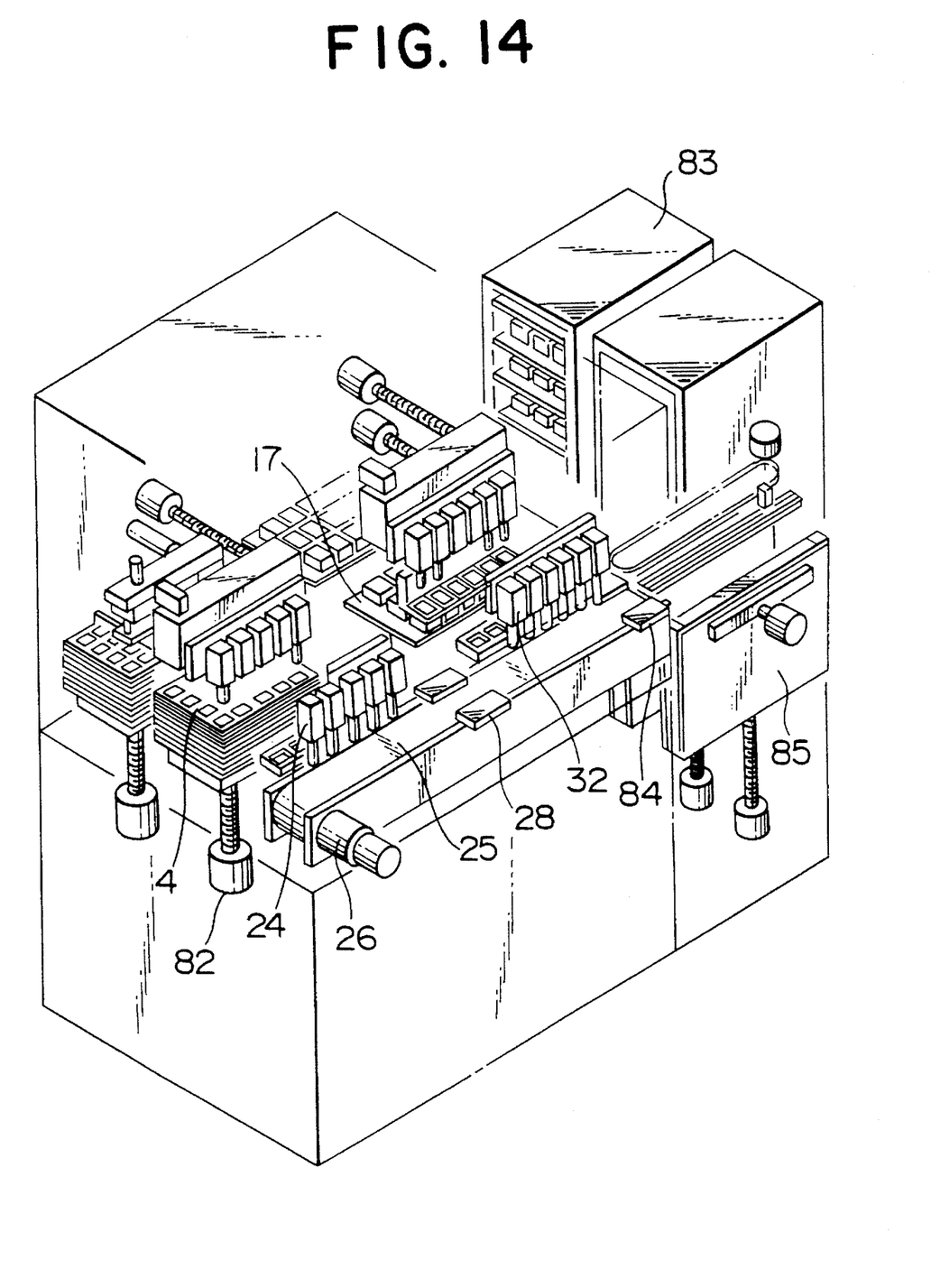
Figure 15:
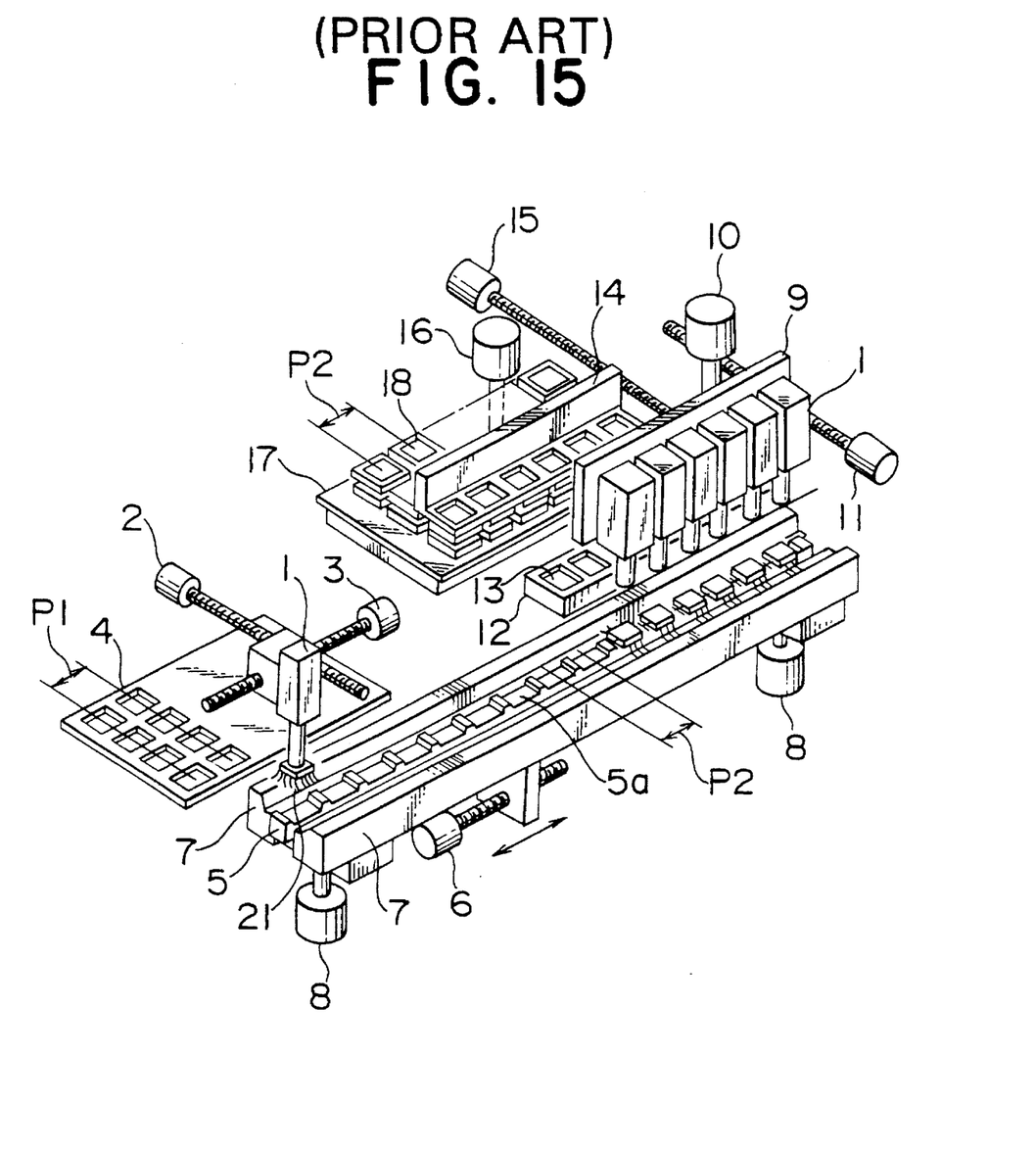

FIG. 14 shows a practically usable IC disposition apparatus. A first adsorption unit 24 is disposed at an end of a stainless steel belt 25 and further a correction unit 28 and a second adsorption unit 32 are disposed along the stainless steel belt 25, respectively. A plurality of accommodation units 4, which accommodate ICs therein, respectively, are stacked up and disposed in the vicinity of the first adsorption unit 24 and a motor 82 is provided to adjust a height of the uppermost accommodation unit 4 to the adsorption unit 24. Further, a stocker 83 for storing a board 17 is disposed in the vicinity of the second adsorption unit 32.

Further, a correction unit 84 similar to the correction unit 28 is disposed at other end of the stainless steel belt 25 and an IC supply unit 85 is disposed adjacent to the correction unit 84. The first adsorption unit 24 supplies the ICs accommodated in the flat-shaped accommodation units onto the stainless steel belt 25, whereas the IC supply unit 85 supplies the ICs accommodated in a tube onto the other end of the stainless steel belt 25. When the ICs are to be taken out from the tube for disposition by means of the IC supply unit 85, a motor 26 is driven in a reverse direction to supply the ICs from the IC supply unit 85 onto the other end of the stainless steel belt 25. The ICs are centered by the correction unit 84 and adsorbed to and held by the second adsorption unit 32 in the same operation as that of the embodiment 1.

Although the above embodiments are described mainly with reference to the ICs as articles to be arranged, the present invention is not limited thereto but may be applicable to any articles so long as they can be transferred by transfer means and held by holding means.

What is claimed is:

1. An article disposition apparatus comprising:

transfer means for transferring articles;

sensing means for sensing the passing of said articles transferred by said transfer means;

supply means for capturing said articles disposed and accommodated at a first pitch in a first accommodating unit and moving said articles to said transfer means, said supply means including a plurality of first holding devices disposed apart from each other at a predetermined first pitch in the direction of transfer carried out by said transfer means;

holding means including a plurality of second holding devices disposed apart from each other at a predetermined second pitch in the direction of transfer carried out by said transfer means for removing said articles transferred by said transfer means and disposing and accommodating said articles to a second accommodation unit at the predetermined second pitch; and control means communicating with said supply means and said holding means for controlling said supply means to capture and move said articles and for controlling said plurality of second holding devices so that said articles being transferred are held by said plurality of holding devices in response to the passing of said articles sensed by said sensing means.

2. The article disposition apparatus according to claim 1, wherein said transfer means includes a belt on which said articles are placed and a motor for driving said belt.

3. The article disposition apparatus according to claim 2, further including a correction unit for centering said articles transferred on said belt to the center in the width direction of said belt.

4. The article disposition apparatus according to claim 3, wherein said correction unit includes a pair of guide plates which move on said belt in the width direction of said belt.

5. The article disposition apparatus according to claim 3, further including a first sensor disposed on the upstream side of said correction unit with respect to the movement of said belt for sensing the passing of said articles on said belt and driving said correction unit.

6. The article disposition apparatus according to claim 3, wherein said sensing means includes a second sensor disposed on the downstream side of said correction unit with respect to the movement of said belt.

7. The article disposition apparatus according to claim 1, wherein said supply means includes a plurality of first adsorption devices each adsorbing and holding an article by vacuum.

8. The article disposition apparatus according to claim 7, wherein said plurality of first adsorption devices are disposed movably along a rail provided with a mounting plate and fixed to said rail by set screws, respectively.

9. The article disposition apparatus according to claim 7, wherein each of said plurality of first adsorption devices includes a housing, an adsorption tube slidably provided with said housing and having an end projecting from said housing to the outside thereof and a spring for urging said adsorption tube so that the end of said adsorption tube is projected to the outside of said housing and said adsorption tube is slid toward the other end thereof against the urging force of said spring in sucking operation.

10. The article disposition apparatus according to claim 1, wherein said holding means includes a plurality of second adsorption devices for adsorbing and holding articles transferred by said transfer means by vacuum.

11. The article disposition apparatus according to claim 10, wherein each of said plurality of second adsorption devices includes a housing, an adsorption tube slidably provided with said housing and having an end projecting from said housing to the outside thereof and a spring for urging said adsorption tube so that the end of said adsorption tube is projected to the outside of said housing and said adsorption tube is slid toward the other end thereof against the urging force of said spring in sucking operation.

12. The article disposition apparatus according to claim 1, wherein each of said holding devices is a mechanical chuck for mechanically holding articles transferred by said transfer means.

13. The article disposition apparatus according to claim 1, wherein each of said holding devices is an electromagnet for holding articles transferred by said transfer means by magnetic force.

14. An article disposition apparatus according to claim 1, wherein said sensing means includes a plurality of sensing units disposed in the vicinity of said respective corresponding holding means.

\* \* \* \* \*